(12) United States Patent
Liu et al.

(10) Patent No.: US 12,532,720 B2
(45) Date of Patent: Jan. 20, 2026

(54) FORMING OPENINGS THROUGH CARRIER SUBSTRATE OF IC PACKAGE ASSEMBLY FOR FAULT IDENTIFICATION

(71) Applicant: Taiwan Semiconductor Manufacturing Company, Ltd., Hsin-Chu (TW)

(72) Inventors: Kao-Chih Liu, Changhua County (TW); Wenmin Hsu, Hsinchu (TW); Hsuan Jung Chiu, Taichung (TW); Yu-Ting Lin, Hsin-Chu (TW); Chia Hong Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 332 days.

(21) Appl. No.: 18/192,770

(22) Filed: Mar. 30, 2023

(65) Prior Publication Data
US 2024/0038587 A1    Feb. 1, 2024

Related U.S. Application Data

(60) Provisional application No. 63/410,098, filed on Sep. 26, 2022, provisional application No. 63/393,716, filed on Jul. 29, 2022.

(51) Int. Cl.
| | |
|---|---|
| *H01L 23/522* | (2006.01) |
| *G01R 31/28* | (2006.01) |
| *H01L 21/768* | (2006.01) |
| *H01L 23/00* | (2006.01) |

(52) U.S. Cl.
CPC .... *H01L 21/76886* (2013.01); *G01R 31/2896* (2013.01); *H01L 23/5226* (2013.01); *H01L 24/16* (2013.01); *H01L 2224/16225* (2013.01)

(58) Field of Classification Search
CPC ........... H01L 21/76886; H01L 23/5226; H01L 24/16; H01L 2224/16225; G01R 31/2896
USPC ... 324/600, 750.27, 76.11, 126, 500, 756.05, 324/538, 762.02
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |

(Continued)

FOREIGN PATENT DOCUMENTS

TW    202310299 A    3/2023

*Primary Examiner* — Giovanni Astacio-Oquendo
*Assistant Examiner* — Trung Q Nguyen
(74) *Attorney, Agent, or Firm* — HAYNES AND BOONE, LLP

(57) ABSTRACT

A semiconductor substrate includes a plurality of transistors. A first structure is disposed over a first side of the semiconductor substrate. The first structure contains a plurality of first metallization components. A carrier substrate is disposed over the first structure. The first structure is located between the carrier substrate and the semiconductor substrate. One or more openings extend through the carrier substrate and expose one or more regions of the first structure to the first side. A second structure is disposed over a second side of the semiconductor substrate opposite the first side. The second structure contains a plurality of second metallization components.

20 Claims, 16 Drawing Sheets

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2014/0306731 A1* | 10/2014 | Wang | G01R 31/311 324/754.07 |
| 2019/0279965 A1* | 9/2019 | Lattard | H01L 25/0657 |
| 2019/0287868 A1* | 9/2019 | Zelikson | H01L 24/17 |
| 2020/0027810 A1* | 1/2020 | Ho | H01L 23/49827 |
| 2020/0395285 A1* | 12/2020 | Dong | H01L 22/32 |
| 2022/0384327 A1 | 12/2022 | Yu | |
| 2023/0025886 A1* | 1/2023 | Fay | H01L 24/24 |
| 2023/0063181 A1 | 3/2023 | Tseng | |
| 2023/0223340 A1* | 7/2023 | Hsu | H01L 23/528 |
| 2024/0006302 A1* | 1/2024 | Livengood | H10D 30/6735 |

\* cited by examiner

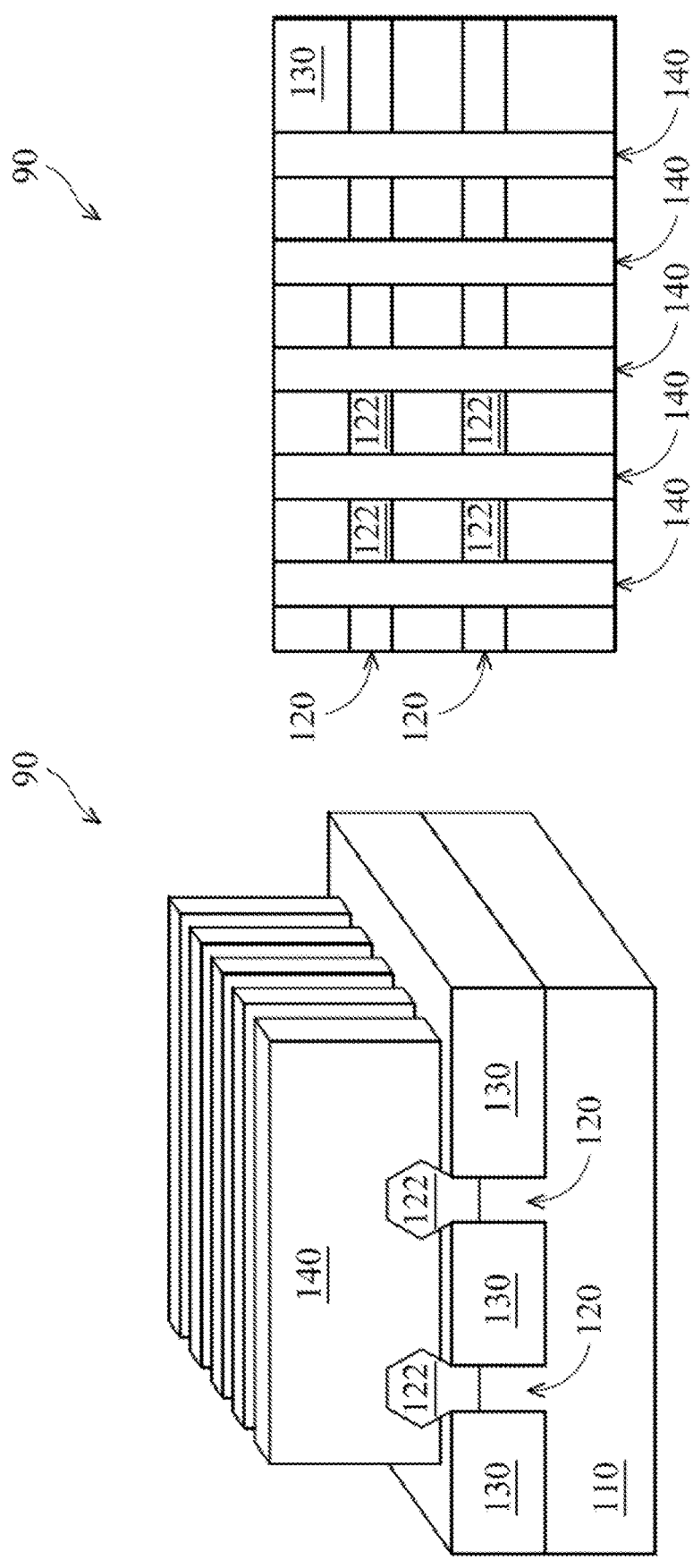
Fig. 1A
Fig. 1B

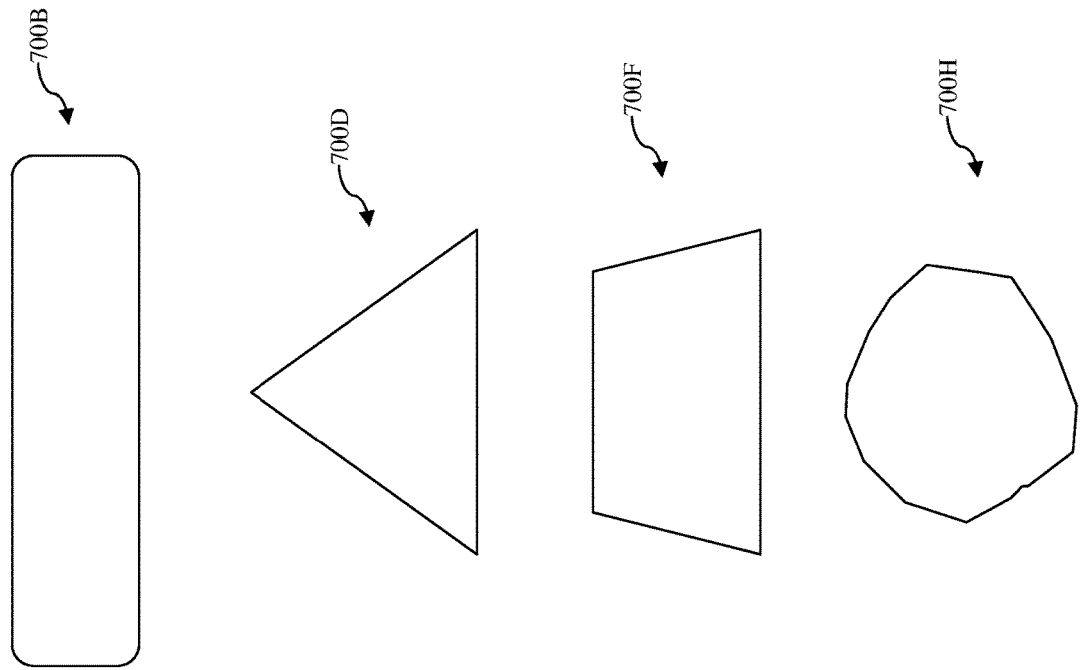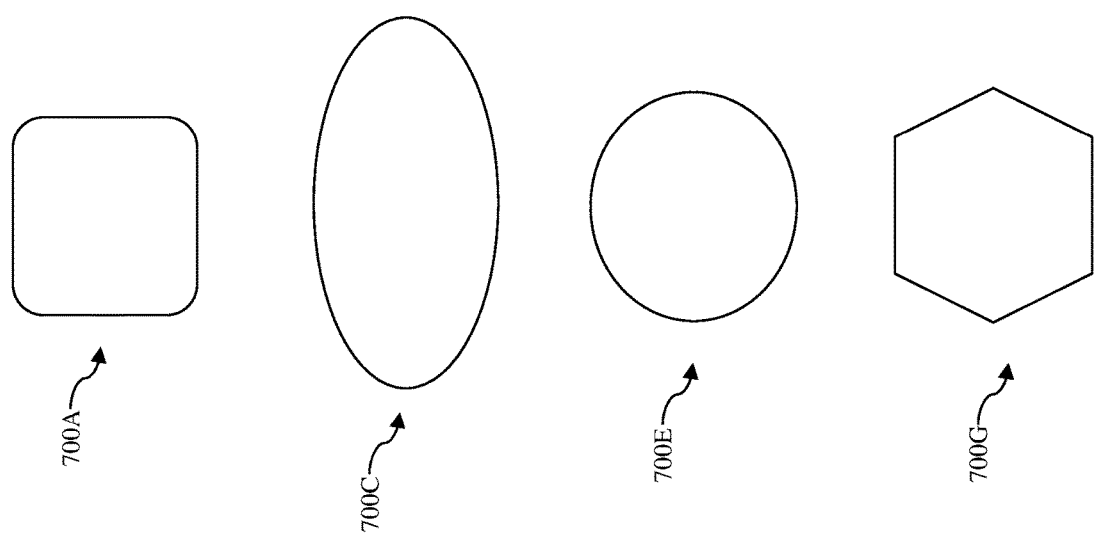
Fig. 12

FORMING OPENINGS THROUGH CARRIER SUBSTRATE OF IC PACKAGE ASSEMBLY FOR FAULT IDENTIFICATION

PRIORITY DATA

The present application is a utility U.S. patent application of provisional U.S. patent application 63/393,716, filed on Jul. 29, 2022, entitled "FORMING OPENINGS THROUGH CARRIER SUBSTRATE OF IC PACKAGE ASSEMBLY FOR FAULT IDENTIFICATION" and provisional U.S. patent application Ser. No. 63/410,098 filed on Sep. 26, 2022, entitled "Forming Openings Through Carrier Substrate Of Ic Package Assembly For Fault Identification" each of which are hereby incorporated herein by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it has brought about certain fabrication challenges. For example, IC chips that have experienced failures or other performance issues may be tested as a part of debugging process to identify the source of the failures or performance issues. However, as the IC chips are manufactured under ever-smaller technology nodes, the debugging of the IC chips may become increasingly difficult. Often times, the existing circuit components (e.g., existing metallization components) on an IC chip may block or otherwise interfere with the debugging process. As a result, although existing IC chip debugging processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

FIG. 12 illustrates planar top view profiles of different embodiments of openings formed in the IC package assembly according to embodiments of the present disclosure.

DETAILED DESCRIPTION

Figure 1C:
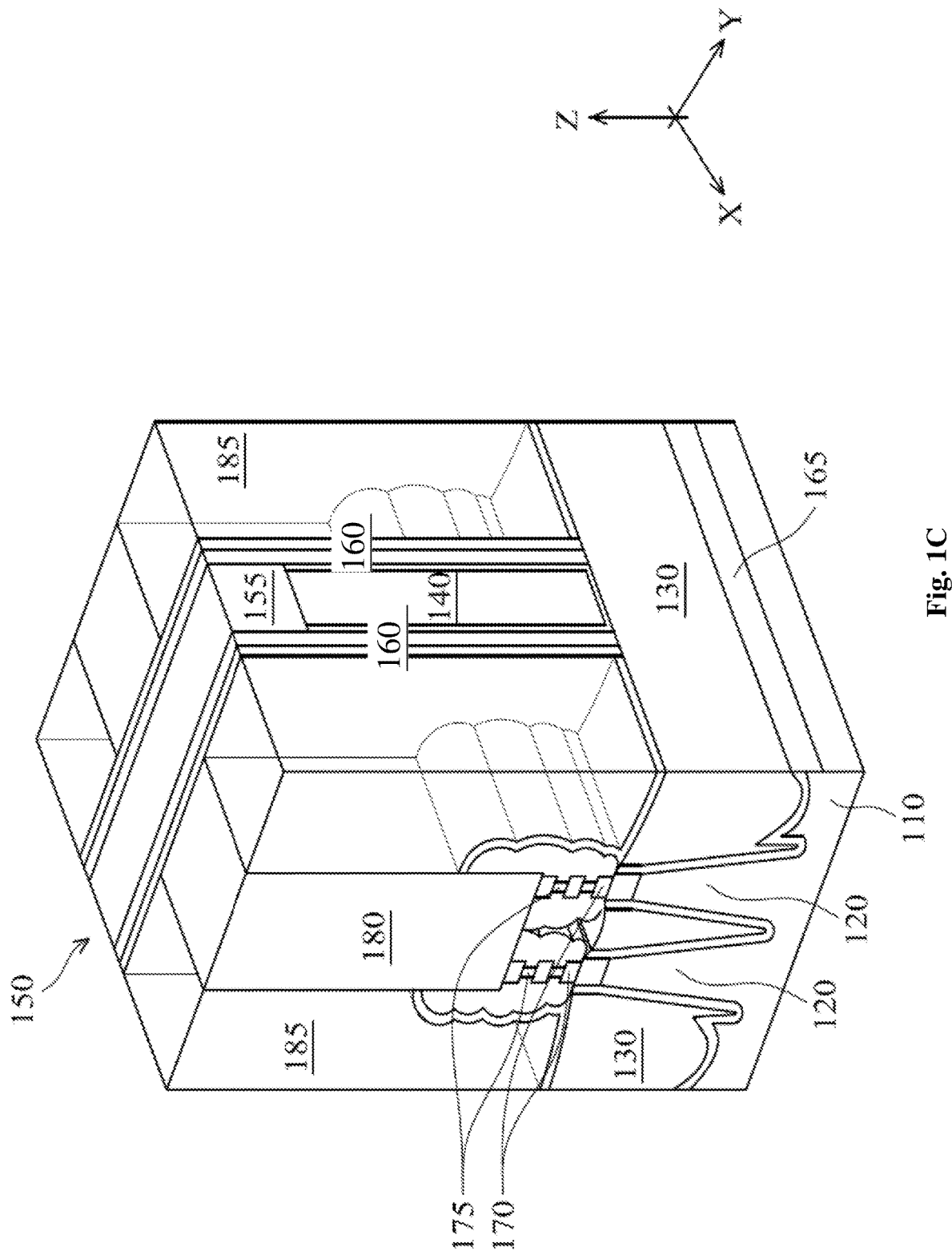
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a unique fabrication process flow to package IC chips, such as Super Power Rail (SPR) chips, such that the IC chips may be conveniently debugged without encountering interference issues with the existing metallization components on the IC chips. In more detail, conventional IC chips typically include a semiconductor substrate on (or in) which transistors are formed. Metallization components are then formed on one side (typically referred to as a "front side") of the substrate. The metallization components may include the metal lines or conductive vias that are parts of a multi-layer interconnect structure. As an IC chip undergoes a debugging process to identify faults, electrical testing signals may be sent to the IC chip to make the IC chip operate in a predetermined mode. The IC chip may emit signals in response to being operated in the predetermined mode, and a signal detection tool (e.g., an electron beam machine (e-beam machine)) may detect the emitted signals. Based on an analysis of the signals emitted from the IC chip under-test, the source (e.g., a location of a failure and/or a reason for the failure) of the faults may be identified.

However, as IC chips progress to more advanced technology nodes, some IC chips (e.g., SPR chips) now have metallization components on both sides of the substrate. In other words, metallization components such as metal lines and vias may exist not only on the front side of the substrate, but on the back side of the substrate as well. As such, regardless of where or how the signal detection tool is placed in relation to the IC chip that is being debugged, the signals emitted by that IC chip may be blocked or otherwise obstructed by the metallization components both on the front side and the back side, which makes testing difficult and unsatisfactory. While it is possible to completely remove the carrier substrate to expose the interconnect structure on the front side for testing purposes, the complete removal of the carrier substrate often damages the metallization components of the interconnect structure, which could render the IC chip defective.

To address the issues discussed above, the present disclosure utilizes a novel packaging and testing process flow to partially remove a carrier substrate of an IC chip to and certain portions of the interconnect structure located at the front side of the IC chip. This forms one or more openings that expose the target regions of the metallization components of the interconnect structure, which allows the signals (emitted by the IC chip under-test) to emit out of the openings without obstruction. The emitted signals may then be detected by a detection tool for fault analysis. A conductive coating layer may also be formed in the one or more openings to serve as a mask and also to promote heat dissipation.

Figure 13:
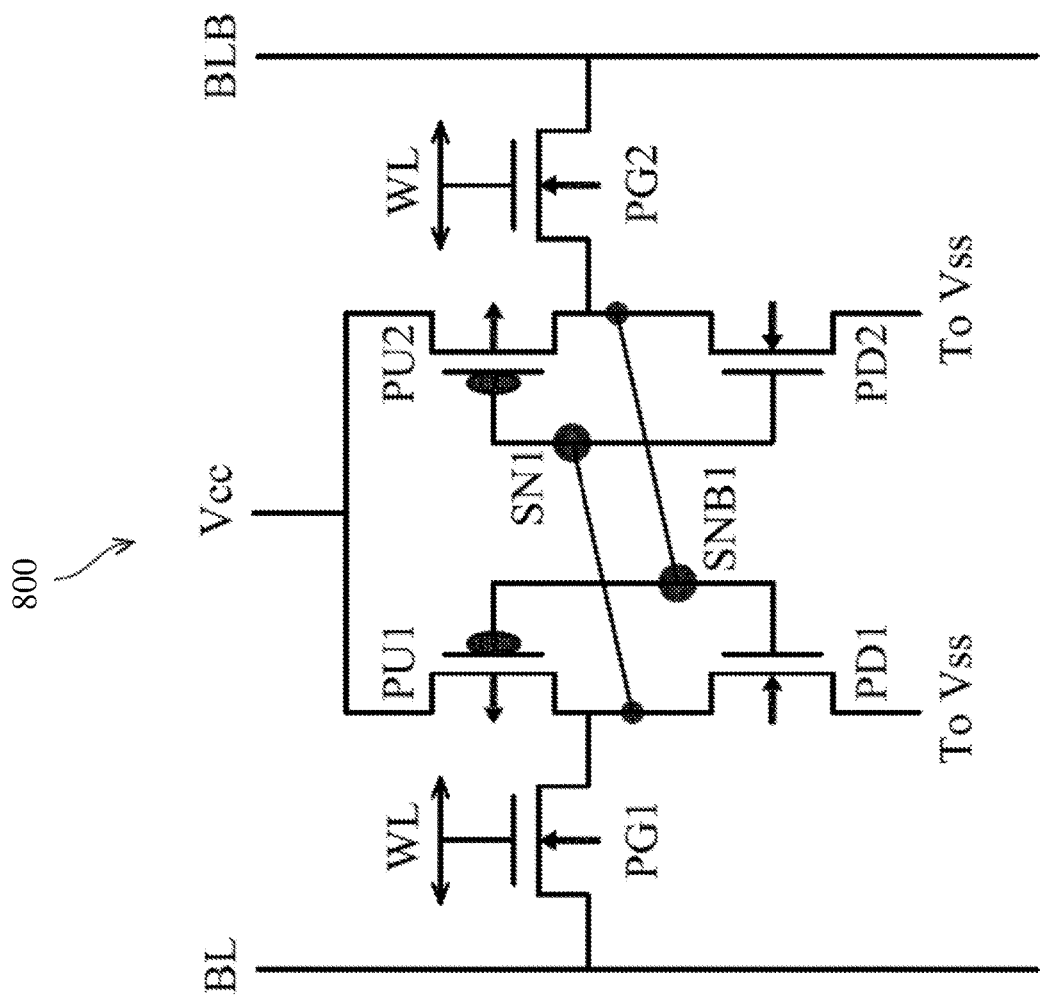
FIG. 13 is a circuit schematic of an SRAM cell according to various aspects of the present disclosure.
Figure 14:
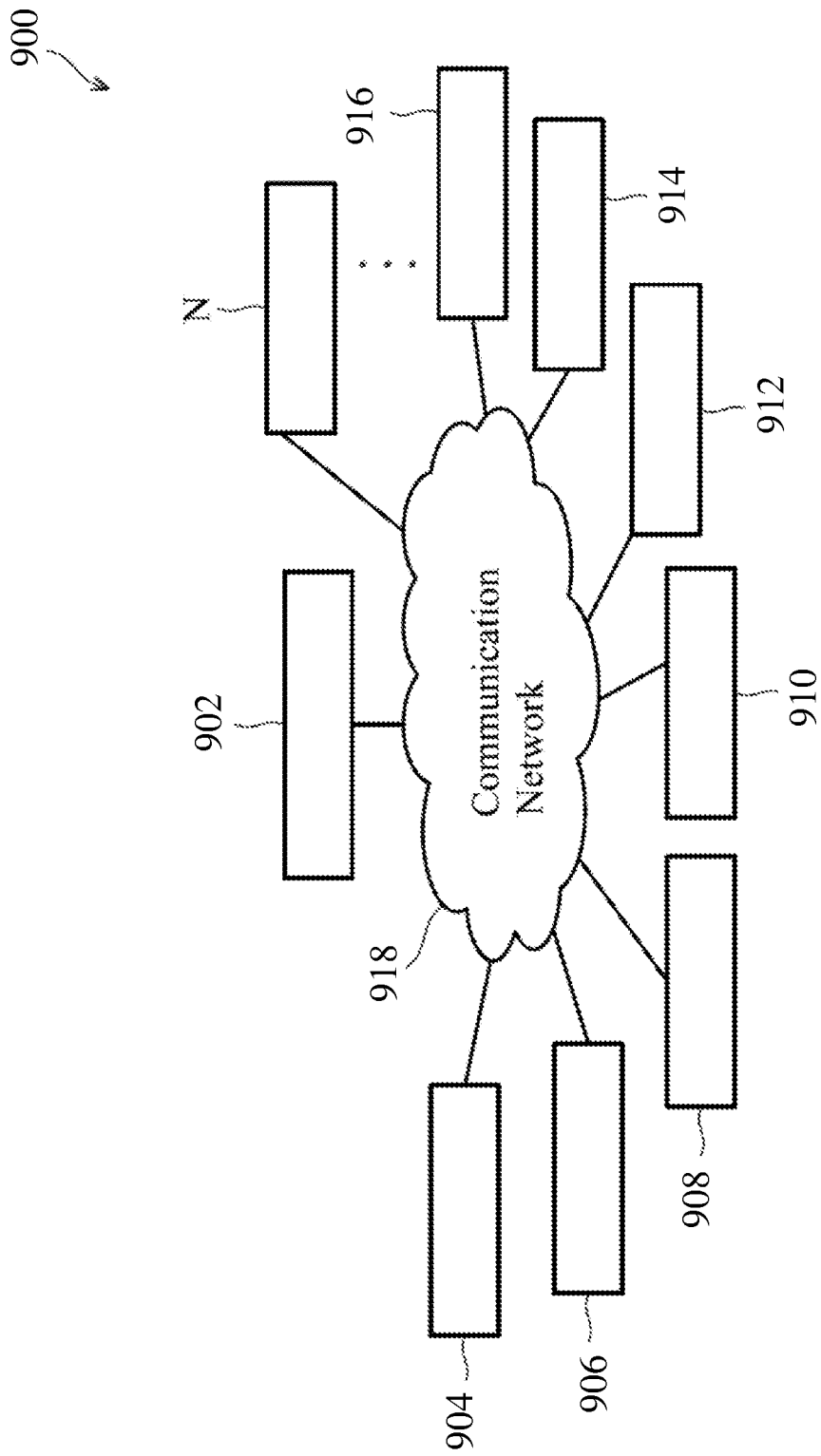
FIG. 14 is a block diagram of a manufacturing system according to various aspects of the present disclosure.
Figure 15:
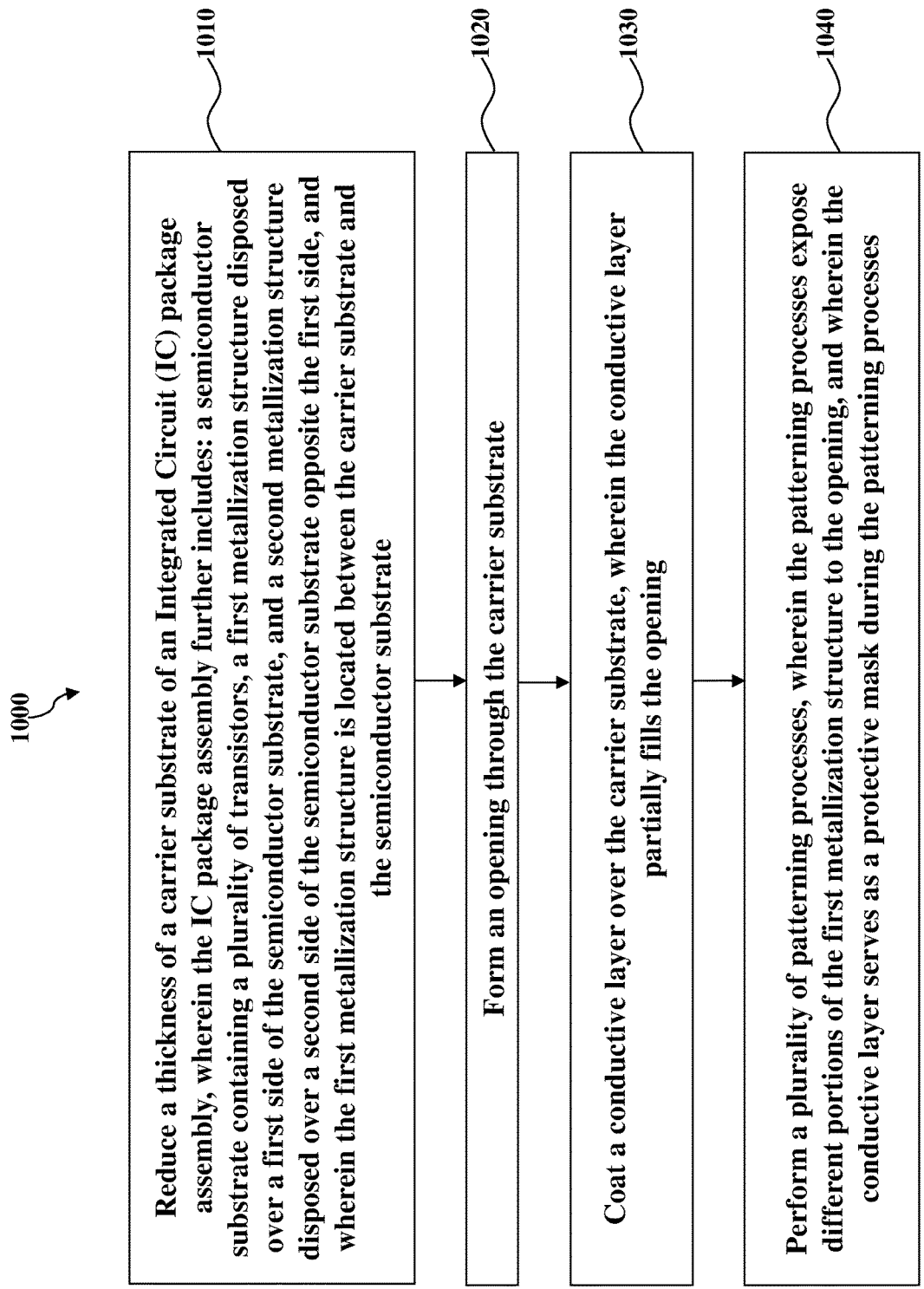
FIG. 15 is a flowchart of a method of packaging and testing an IC chip according to various aspects of the present disclosure.

The various aspects of the present disclosure are now discussed in more detail with reference to FIGS. 1A, 1B, 1C, and 2-16. In more detail, FIGS. 1A-B illustrate an example FinFET device, and FIG. 1C illustrates an example GAA device. FIG. 2-10 illustrate cross-sectional side views of an IC package assembly at various stages of packaging/testing according to embodiments of the present disclosure. FIG. 11 illustrates a planar top view of the IC package assembly according to embodiments of the present disclosure. FIG. 12 illustrates various planar top view profiles of different embodiments of an opening that is formed in the IC package assembly according to embodiments of the present disclosure. FIG. 13 illustrates a memory device in which the IC die of the present disclosure may be implemented. FIG. 14 illustrates a semiconductor fabrication system that may be used to fabricate the IC device of the present disclosure. FIG. 15 illustrates a flowchart of a method according to embodiments of the present disclosure.

Referring now to FIGS. 1A and 1B, a three-dimensional perspective view and a top view of a portion of an Integrated Circuit (IC) device 90 are illustrated, respectively. The IC device 90 is implemented using field-effect transistors (FETs) such as three-dimensional fin-line FETs (FinFETs). FinFET devices have semiconductor fin structures that protrude vertically out of a substrate. The fin structures are active regions, from which source/drain region(s) and/or channel regions are formed. Source/drain region(s) may refer to a source or a drain, individually or collectively dependent upon the context. A source/drain region may also refer to a region that provides a source and/or drain for multiple devices. The gate structures partially wrap around the fin structures. In recent years, FinFET devices have gained popularity due to their enhanced performance compared to conventional planar transistors.

As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 (also referred to source/drain regions) may refer to a source or a drain of a transistor, individually or collectively, dependent upon the context. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structures 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A layer 155 is located over the gate structure 140, and gate spacer structures 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, input/output (I/O) devices, application specific integrated circuit (ASIC) devices, radio frequency (RF) circuitries, drivers, micro-controllers, central processing units (CPUs), image sensors, etc., as non-limiting examples.

Figure 2:
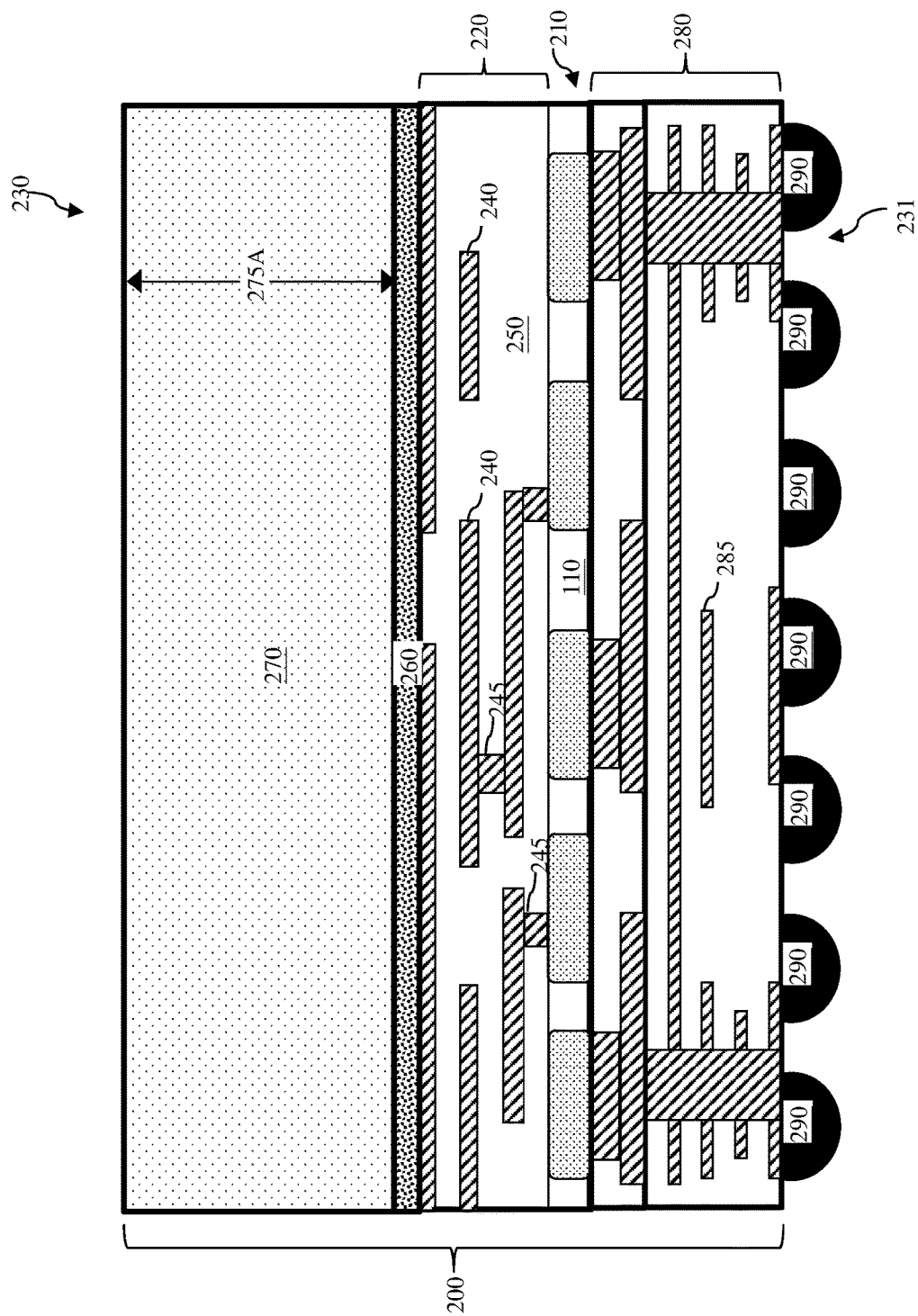
FIGS. 2-10 illustrate a series of cross-sectional side views of an IC package assembly at various stages of packaging and testing according to embodiments of the present disclosure.

FIG. 2 illustrates a diagrammatic fragmentary cross-sectional side view of an IC die 200 that contains the FinFET or GAA transistors of FIGS. 1A-1C discussed above according to various embodiments of the present disclosure. The IC die 200 has metallization components on both its front side and its back side. As discussed above, such an arrangement of the metallization components could cause the signals emitted by the IC die 200 (and meant to be detected by a detection tool) to be blocked by the metallization components, which could interfere with a debugging process. To address this issue, the present disclosure involves a novel packaging process flow, so that the signals emitted by the IC chip can be detected by the detection tool without obstruction. The process flow herein also need not remove a carrier substrate completely, which in turn avoids potential damage caused by the complete removal of the carrier substrate, as discussed in more detail below.

Still referring to FIG. 2, the IC die 200 in the illustrated embodiment is a Super Power Rail (SPR) die. In that regard, in conventional chip structures, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. To alleviate these concerns, SPR chips may implement a back side source/drain contact through the substrate of the SPR chip to come in contact with a source/drain feature, and a power rail is formed on the back side of the substrate to be in contact with the back side source/drain contact. Since the implementation of SPR structures eases the crowding of contacts, SPR chips entail a modern solution for performance boost on power delivery network (PDN) for advanced technology nodes.

Additional details of the IC die 200 are now discussed below. The IC die 200 includes the substrate 110 discussed above, which may comprise an elementary (single element) semiconductor, a compound semiconductor, an alloy semiconductor, and/or other suitable materials. The IC die 200 also includes a plurality of transistors 210 formed in or on the substrate 110. The transistors 210 may include the FinFET transistors shown in FIGS. 1B-1C and/or the GAA transistors shown in FIG. 1C. The transistors 210 may include active regions, such the fin structures 120 or the stacks of nano-structures 170 discussed above in association with FIGS. 1A-1C. The transistors 210 may also include High-k metal gate (HKMG) structures 140 discussed above, which may partially wrap around the active regions (e.g., wrapping around a fin structure). As discussed above, the HKMG structures may be formed by replacing dummy gate structures, and they may each include a high-k gate dielectric and a metal-containing gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), titanium aluminum nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. For reasons of simplicity, the details of the transistors 210 are not illustrated in FIG. 2 or the subsequent figures.

The substrate 110 has two opposite sides, for example, a side 230 and a side 231. The side 230 may also be interchangeably referred to hereinafter as a front side of the IC die 200, and the side 231 may also be interchangeably referred to hereinafter as a back side of the IC die 200. A multi-layer interconnect structure 220 is formed on the side 230 of the substrate 110. The interconnect structure 220 includes a plurality of patterned dielectric layers and interconnected conductive layers. These interconnected conductive layers provide interconnections (e.g., wiring) between circuitries, inputs/outputs, and various doped features formed in the substrate 110. For example, the interconnect structure 220 may include a plurality of interconnect layers, also referred to as metal layers (e.g., M1, M2, M3, etc). Each of the interconnect layers includes a plurality metal lines, such as metal lines 240. The interconnect structure 220 may also include a plurality of conductive vias, such as conductive vias 245, that electrically couple the various metal lines 240 together. The metal lines 240 and the conductive vias 245 may contain conductive materials, such as aluminum, copper, aluminum alloy, copper alloy, aluminum/silicon/copper alloy, titanium, titanium nitride, tantalum, tantalum nitride, tungsten, cobalt, ruthenium, metal silicide, or combinations thereof. The interconnect structure 220 also includes an interlayer dielectric (ILD) 250 that provides electrical and physical isolation between the interconnect layers. The ILD 250 may include a dielectric material such as an oxide material or a low-k dielectric. It may be said that the metal lines 240 and the conductive vias 245 are embedded in the ILD 250.

A bonding layer 260 is disposed over the interconnect structure 220. The bonding layer 260 has a different material composition than the substrate 110. In some embodiments, the bonding layer 260 includes a dielectric material, whereas the substrate 110 includes a semiconductor material. For example, the bonding layer 260 may include a silicon oxide material, while the substrate 110 includes a crystal silicon material. The bonding layer 260 bonds a carrier substrate 270 to a rest of the IC die 200. For example, the interconnect structure 220 is bonded to the carrier substrate 270 through the bonding layer 260. In some embodiments, the carrier substrate 270 includes bulk silicon. In other embodiments, the carrier substrate 270 includes another suitable material that provides sufficient rigidity and/or mechanical support for the rest of the IC die 200. The carrier substrate 270 has an initial thickness 275A. In some embodiments, the initial thickness 275A is greater than several hundred microns. For example, the initial thickness 275A is in the range between about 1 millimeter and about 5 millimeters.

While the interconnect structure 220, the bonding layer 260, and the carrier substrate 270 are located on the side 230 (e.g., the front side) of the substrate 110, a power delivery network (PDN) 280 is formed on the side 231 (e.g., the back side) of the substrate 110. The PDN 280 is a structure that delivers power and ground voltages from conductive pad locations to the various components (e.g., the transistors 210) of the IC die 200. In some embodiments, the PDN 280 includes a plurality of layers, where each layer includes one or more power rails and/or ground rails, such as rails 285. The power rails or ground rails may be in the form of metal lines. The various layers of the PDN 280 may be electrically interconnected together by conductive vias. Electrical connectivity to the PDN 280 (and to the rest of the IC die 200) may be gained by conductive bumps 290 (e.g., solder balls) that are located on the side 231 of the PDN 280.

Since the PDN 280 includes metal lines and vias, as does the interconnect structure 220, it may be said that the IC die 200 has metallization components formed on both its front side 230 and its back side 231. In a conventional IC die where no PDN is implemented on its back side (i.e., similar to back side 231 herein), signals emitted by the IC die when the IC die is being debugged may be detected by a signal detection tool placed on the back side 231 of the IC die without obstruction or interference from metallization components. However, for the IC die 200 illustrated herein, the metal lines and/or vias of the PDN 280 may at least partially block the transmission of the signals emitted by the IC die 200. Another approach is to remove the carrier substrate 270 and the bonding layer 260 to expose the interconnect structure 220, so that a signal detection tool placed at the front side 230 of the IC die 200 may detect signals emitted from the IC die 200 through the metal lines 240 to perform fault analysis of the IC die 200. However, a complete removal of the carrier substrate 270 may damage the components of the interconnect structure 220, for example, by causing some of the metal lines 240 and/or the vias 245 to collapse, shift, and/or deform. This may lead to electrical shorting in some cases, or the signal detection tool receiving noisy and/or inadequate signals from the interconnect structure 220 in other cases.

To address these issue, the present disclosure involves a packaging and testing process flow where the carrier substrate 270 is partially (but not completely) removed to form openings that extend from the front side 230 toward the back side 231. These openings are configured to expose some of the metal lines 240 of the interconnect structure 220. The exposed metal lines may belong to different metal layers and are electrically connected to the transistors 210 that are under test (e.g., being debugged for fault analysis). As such, the signals emitted by the transistors 210 under-test may transmit through the exposed metal lines 240 and propagate toward the front side 230 of the IC die 200 through the openings formed in the carrier substrate 270. The signals may then be detected by a signal detection tool placed at the front side 230 of the IC die 200 without being obstructed, as discussed in greater detail below.

Figure 3:
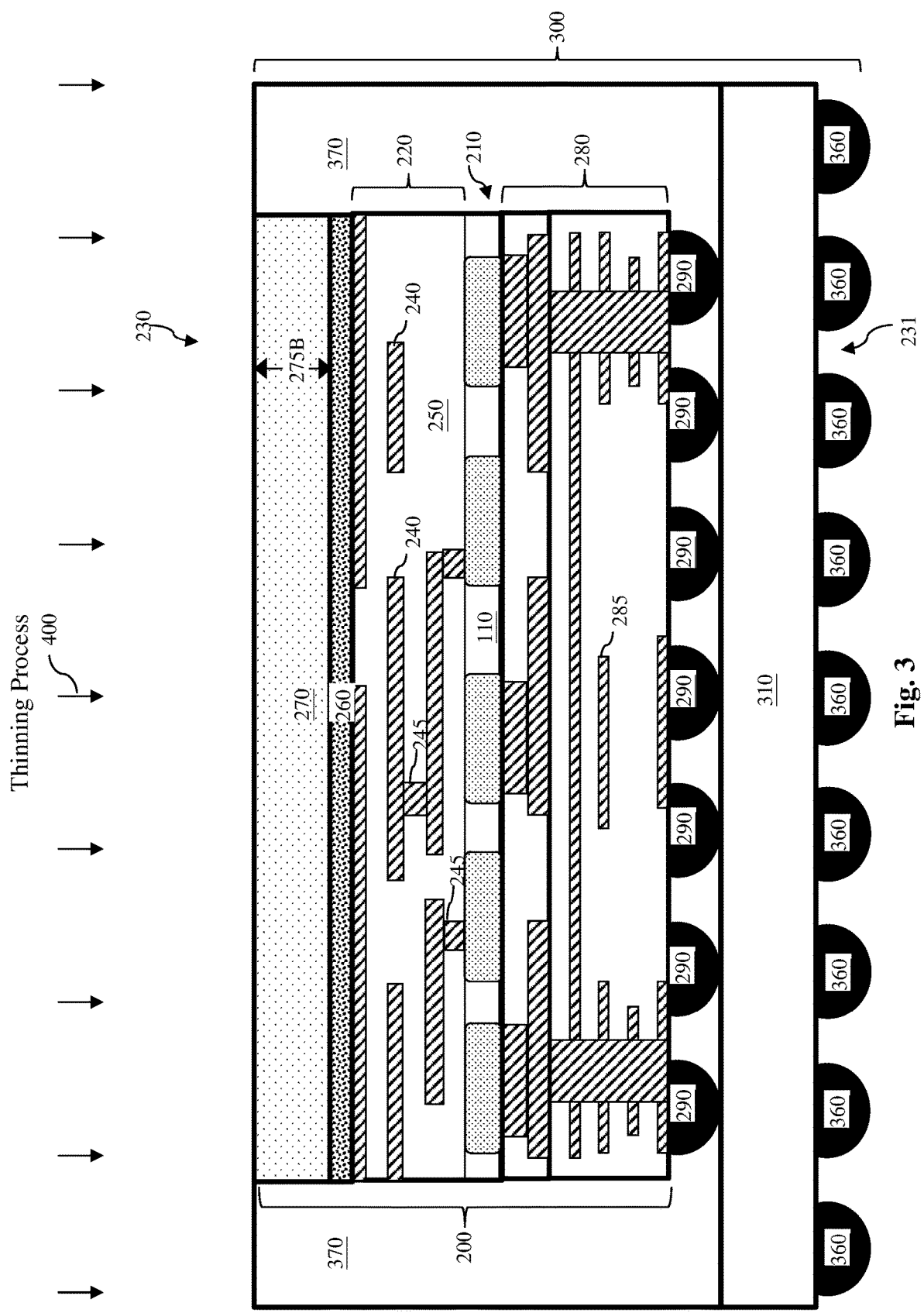

Referring now to FIG. 3, the IC die 200 may be implemented as a part of an IC package assembly 300 (also interchangeably referred to hereinafter as an IC chip 300). The IC package assembly 300 further includes a substrate 310 that is attached to the IC die 200. In some embodiments, the substrate 310 include a printed circuit board (PCB), which may include a plurality of layers that are each configured to route electrical signals. For example, the PCB may include a plurality of metal lines in each of the layers. The PCB may also include a plurality of vias that interconnect the metal lines from different layers. The metal lines and the vias are isolated from one another by a dielectric material, such as an oxide material or a nitride material. The substrate 310 may further include a plurality of conductive bumps 360 that are located on the back side 231.

The IC die 200 is bonded to the substrate 310 through the back side 231 of the IC die 200. For example, the conductive bumps 290 are bonded between the IC die 200 and the substrate 310, while a molding material 370 (e.g., an organic compound) surrounds the IC die 200. The conductive bumps 290 allow electrical signals to be transmitted between the IC die 200 and the substrate 310, while the molding material 370 provides electrical isolation and physical protection for the IC die 200 and the substrate 310.

The various layers of the substrate 310 may be utilized to perform additional electrical routing for the IC die 200. In some embodiments, the substrate 310 has no active electrical circuitry that contains transistors. In some other embodiments, the substrate 310 may include additional electrical circuitry (which does contain transistors), which may provide the same functionalities as the electrical circuitry on the IC die 200 or may provide different functionalities from the electrical circuitry on the IC die 200.

In some embodiments, the IC package assembly 300 may be an IC package assembly that is ready for sale to customers. In other words, a customer may purchase the IC package assembly 300 from its manufacturer and implement the IC package assembly 300 on modern day electronic devices, such as desktop or laptop computers, mobile telephones, televisions, radios, automobiles, satellite positioning devices, household appliances, etc. However, from time to time, copies of the IC package assembly 300 may experience failure or run into various bugs, either during actual use or during testing before or after it is shipped to a customer. Such a failed or buggy copy of the IC package assembly 300 may then be tested as a part of a debugging process to identify the reason and/or source of the failure. In such a debugging process, a signal detection tool is used to detect and analyze signals emitted by the IC die 200 to identify the faults that have occurred. However, the metallization components of the PDN 280 and/or the substrate 310 may obstruct the emission of the signals from the back side 231, while the metallization components of the interconnect structure 220 and/or the substrate 270 may obstruct the emission of the signals from the front side 230. The obstruction of the signal emission from the IC die 200 may interfere with the debugging process, since the signal detection tool may not be able to accurately detect and analyze the obstructed signals.

One approach is to completely remove the carrier substrate 270, which then exposes the interconnect structure 220 and allows the signals from the IC die 200 to be emitted through the interconnect structure 220 without obstruction and be detected by a detection tool placed at the front side 230 of the IC die 200. However, the complete removal of the carrier substrate 270 may cause damage to the metallization components of the interconnect structure 220. For example, the metal lines 240 and/or the vias 245 may collapse, shift, or otherwise become deformed as a result of the complete removal of the carrier substrate 270, and this may lead to electrical shorting among the metallization components, and/or inaccurate or inadequate signals to be detected by the signal detection tool placed at the front side 230 of the IC package assembly 300.

In order to address these concerns, the present disclosure partially removes the carrier substrate 270 to form openings through the substrate, which expose target portions of the interconnect structure 220. In this manner, during a debugging process, the signals generated by the IC die 200 may still be emitted from the exposed portions of the interconnect structure 220 without obstruction, so that they can be accurately detected by the signal detection tool. Meanwhile, the remaining portions of the carrier substrate 270 may still offer protection for the IC die 200 from potential mechanical damage, contaminant particles, and/or moisture from water vapor.

As a first step of the partial removal of the carrier substrate 270, a thinning process 400 is performed to the IC package assembly 300 from the front side 230. The thinning process 400 may use a mechanical grinding process to remove a substantial majority portion of the carrier substrate 270. After the thinning process 400 is performed, the initial thickness 275A of the carrier substrate 270 is reduced down to a thickness 275B. In some embodiments, the thickness 275B is less than about 10 microns. For example, the thickness 275B may be in a range between about 1 micron and about 10 microns. Such a range of the thickness 275B allows relatively shallow openings to be formed in the carrier substrate 270, which entails an easier processing window.

Figure 4:
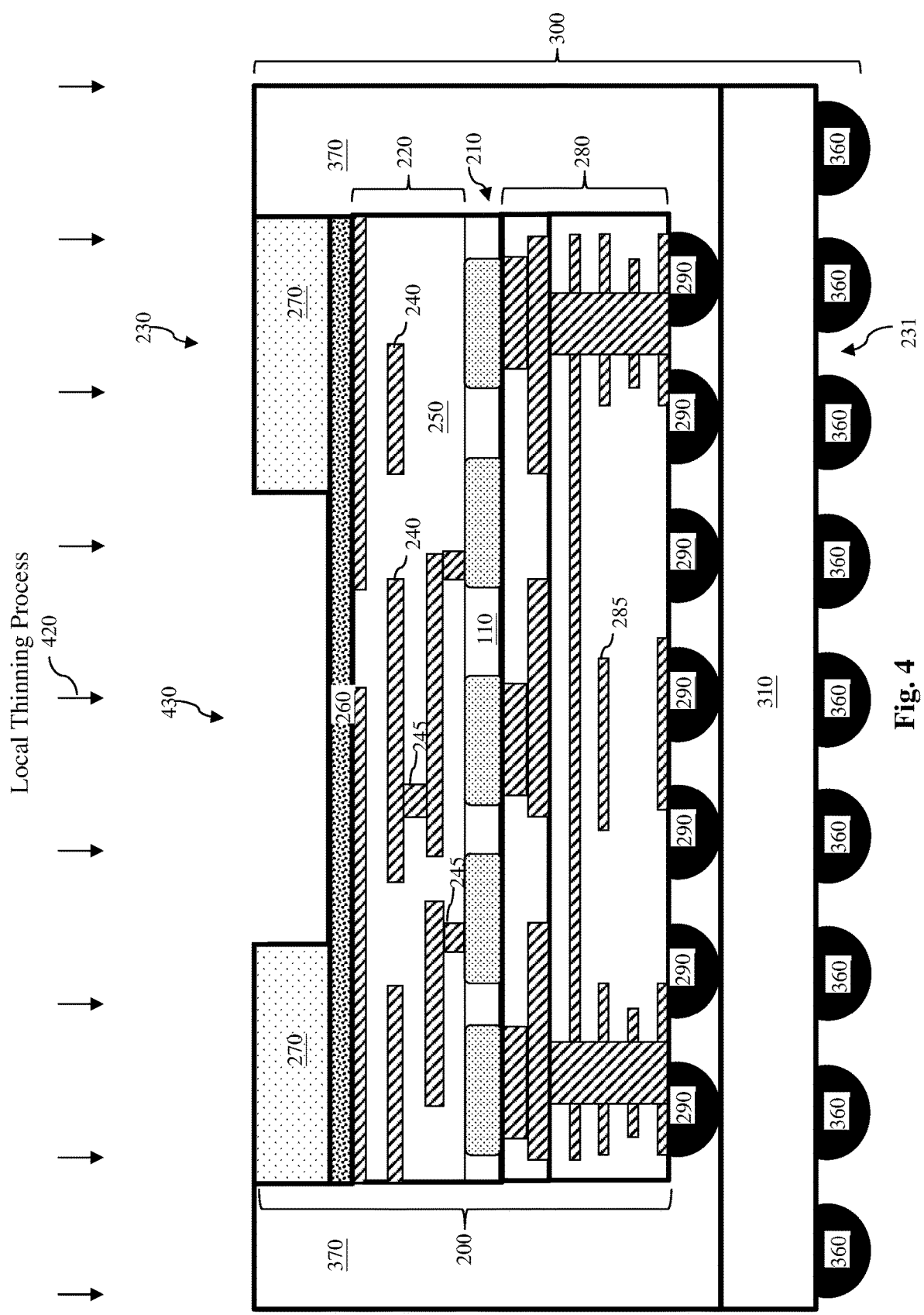

Referring now to FIG. 4, a local thinning process 420 is performed to the IC package assembly 300 to form an opening 430 in the IC package assembly 300. In some embodiments, the local thinning process 420 is performed using a mechanical drill bit. The opening 430 extends from the front side 230 toward the back side 231 of the IC package assembly 300, and it extends through the carrier substrate 270 but not the bonding layer 260. A portion of the bonding layer 260 is exposed by the opening 430.

Figure 5:
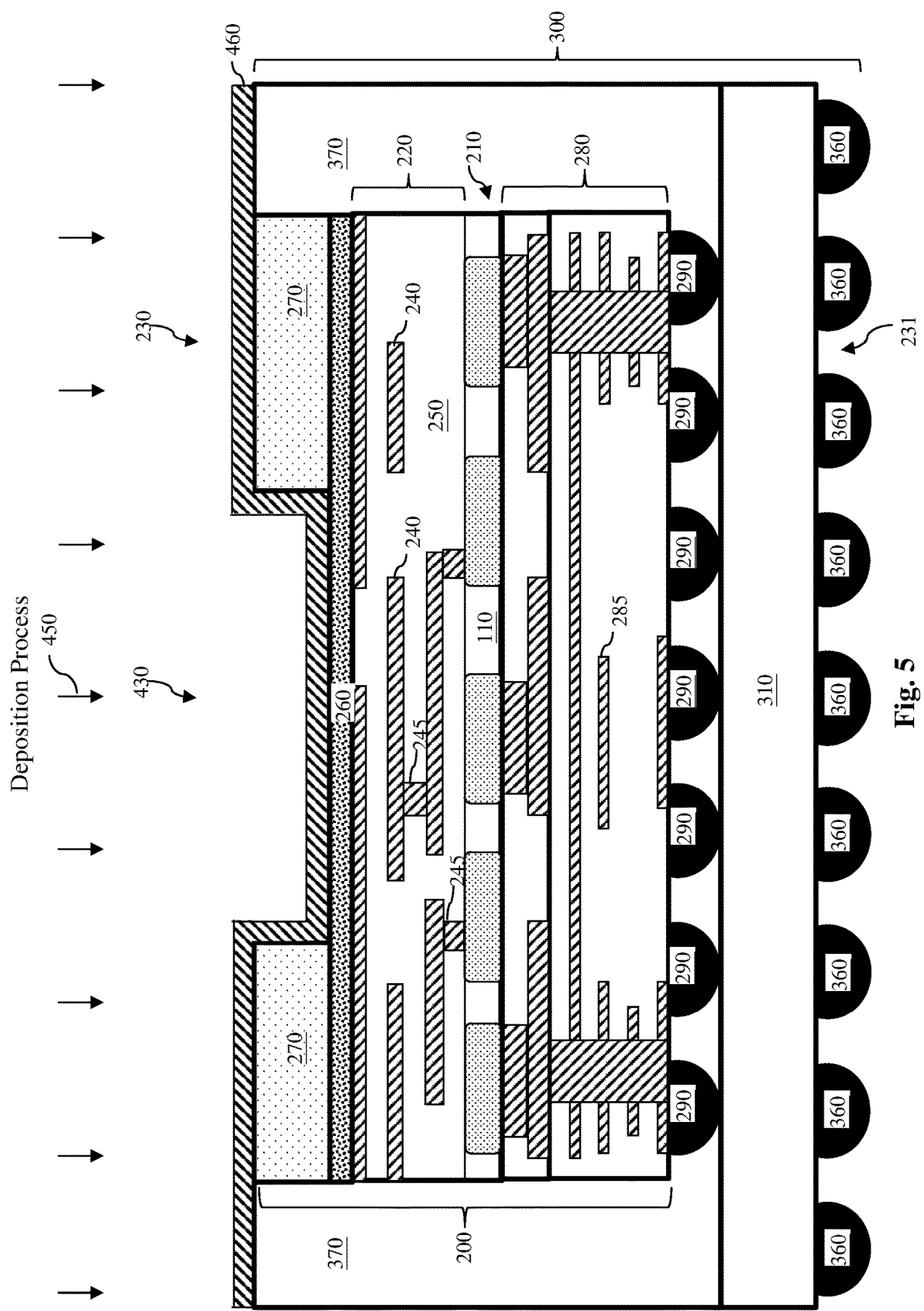

Referring now to FIG. 5, a deposition process 450 is performed to the IC package assembly 300 to coat the opening 430 with a conductive layer 460. In some embodiments, the conductive layer 460 includes a metal material, such as platinum. The conductive layer 460 partially fills the opening 430 and is formed on the side and bottom surfaces of the opening 430. For example, the conductive layer 460 is formed on the sidewalls of the carrier substrate 270 and on the upper surface of the bonding layer 260. The conductive layer 460 is also formed on the upper surface of the carrier substrate 270. The conductive layer 460 may serve as a mask for a patterning process performed later. The conductive layer 460 also promotes heat dissipation, since it is not only electrically conductive but also thermally conductive.

Figure 6:
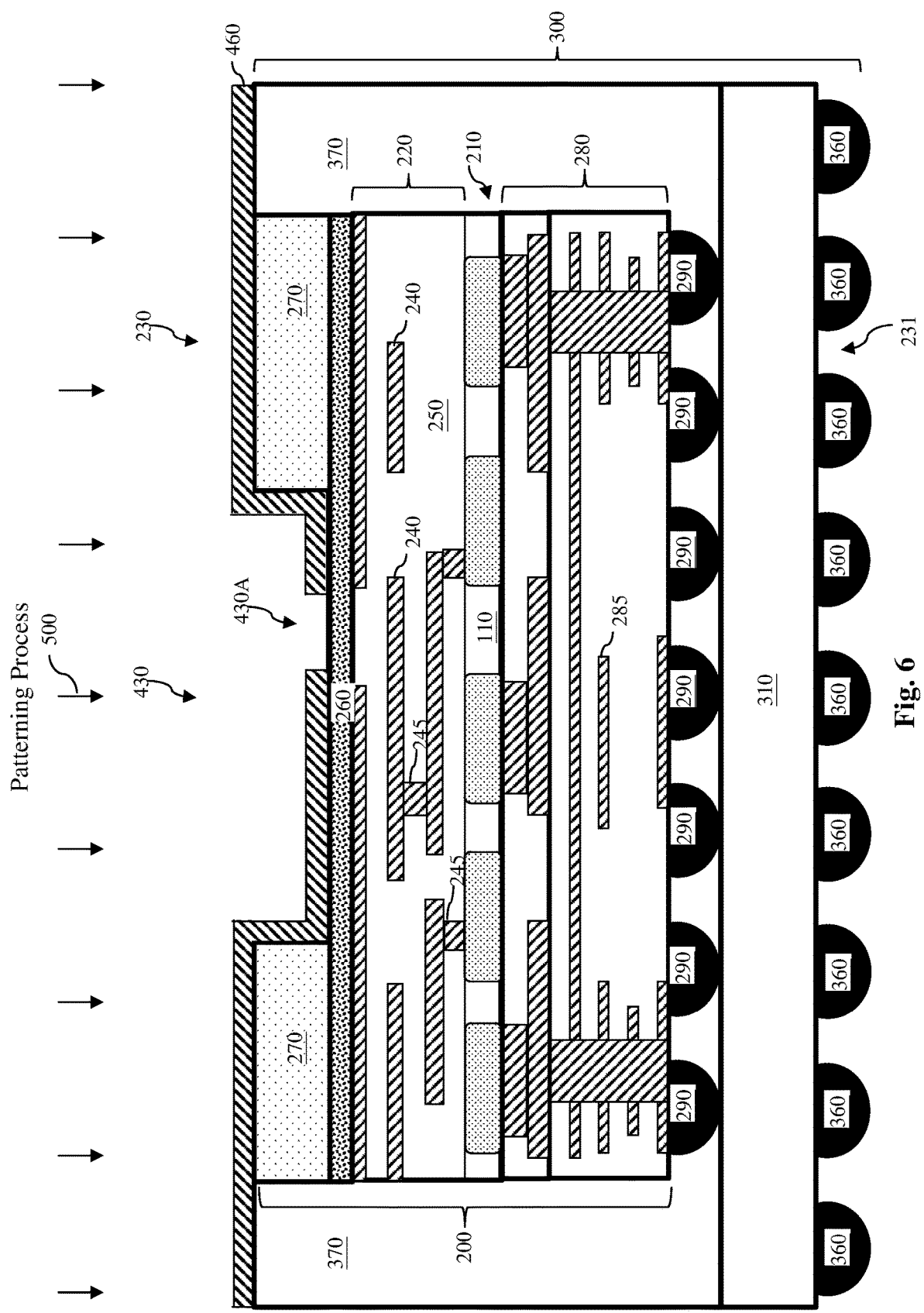

Referring now to FIG. 6, a patterning process 500 is performed to the IC package assembly 300 to extend the opening 430 through a portion of the conductive layer 460. In other words, an opening 430A may be formed in the conductive layer 460. The opening 430A exposes a region of the bonding layer 260. In some embodiments, a lateral dimension of the opening 430A (or its width) may be in a range between about 3 microns and about 100 microns.

Figure 7:
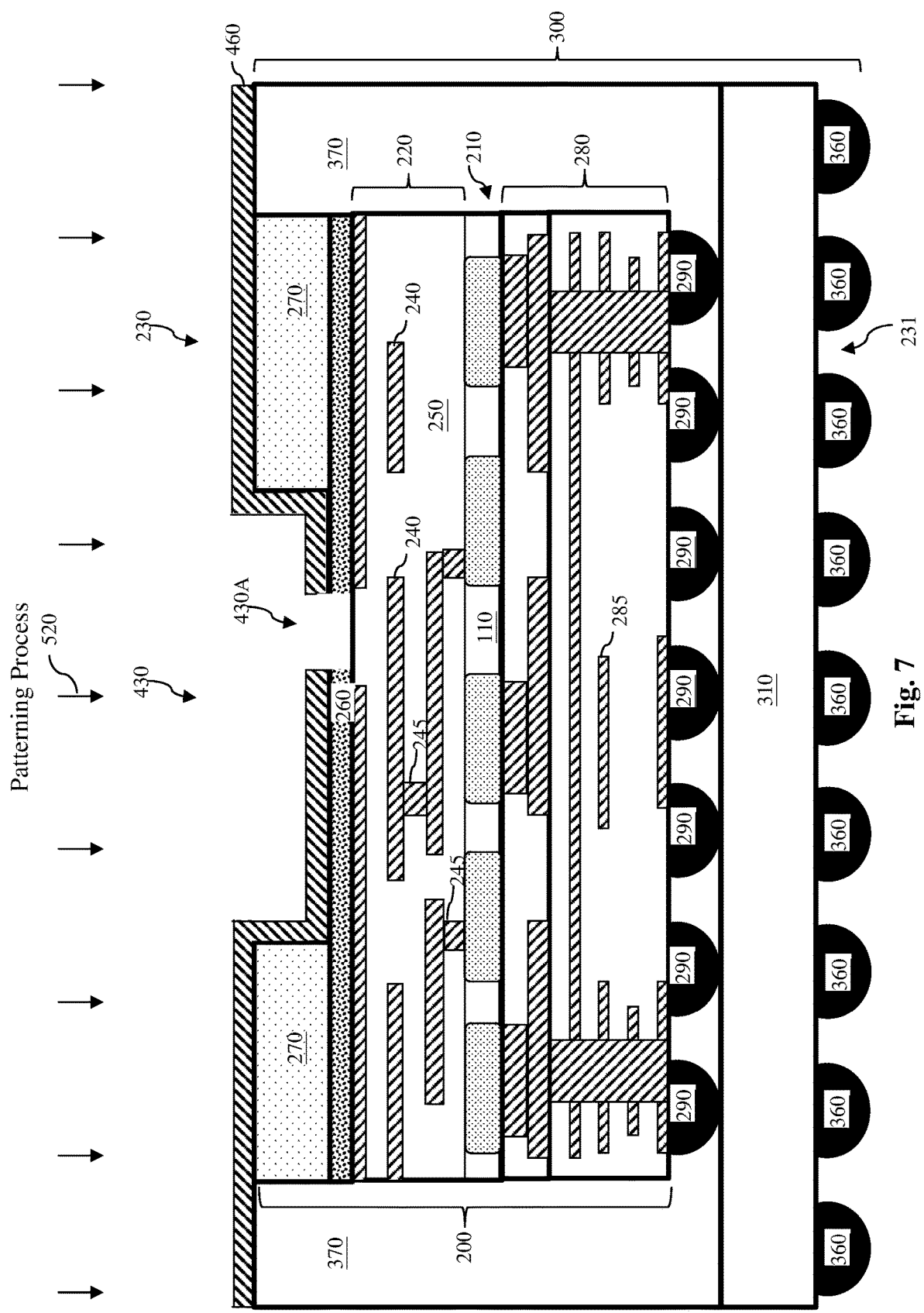

Referring now to FIG. 7, a patterning process 520 is performed to the IC package assembly 300 to extend the opening 430A through the bonding layer 260. The opening 430A stops at, and exposes, a region of the interconnect structure 220. In some embodiments, the patterning process 520 includes an etching process, such as a dry etching process or a wet etching process. The conductive layer 460 may serve as an etching mask layer during such an etching process. For example, the etching process may be configured with a sufficiently high etching selectivity between the conductive layer 460 and the bonding layer 260, such that the bonding layer 260 is etched away at a substantially higher rate than the conductive layer 460. As a result, the opening 430A may extend vertically through the bonding layer 260 without substantially affecting the conductive layer 460.

Figure 8:
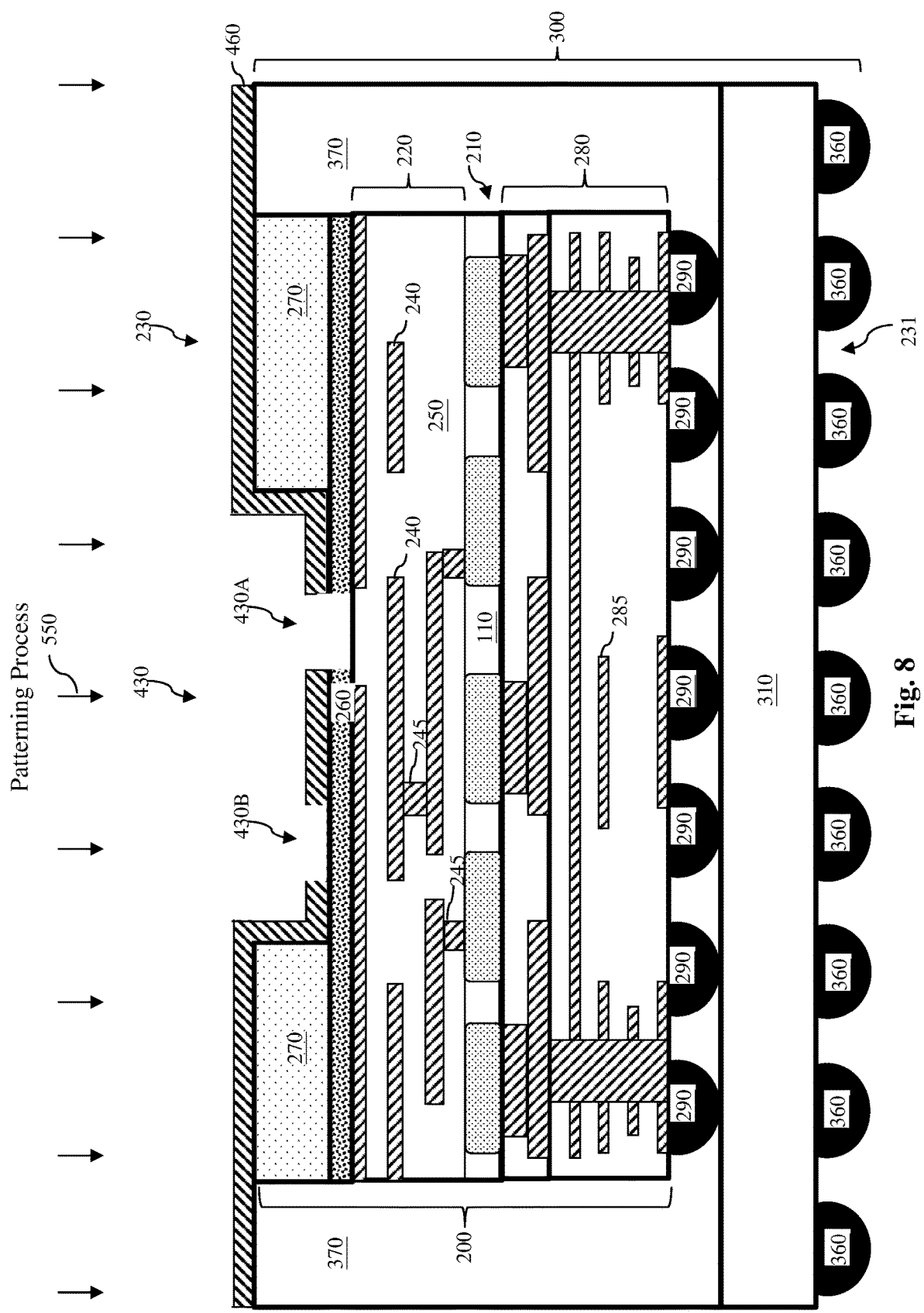

Referring now to FIG. 8, a patterning process 550 is performed to the IC package assembly 300 to extend the opening 430 through another portion of the conductive layer 460. In other words, an opening 430B may be formed in the conductive layer 460, and the opening 430B exposes another region of the bonding layer 260. In some embodiments, a lateral dimension of the opening 430B (or its width) may be in a range between about 3 microns and about 100 microns. Note that the opening 430A and 430B may have different lateral dimensions in some embodiments, or similar lateral dimensions in some other embodiments. In some embodiments, the patterning process 550 includes an etching process, such as a dry etching process or a wet etching process. However, unlike the etching process of the patterning process 520, the etching process of the patterning process 550 may be configured to remove the conductive layer 460 at a substantially higher rate than the bonding layer 260. As a result, the opening 430B may extend vertically through the conductive layer 460 without substantially affecting the bonding layer 260.

Figure 9:
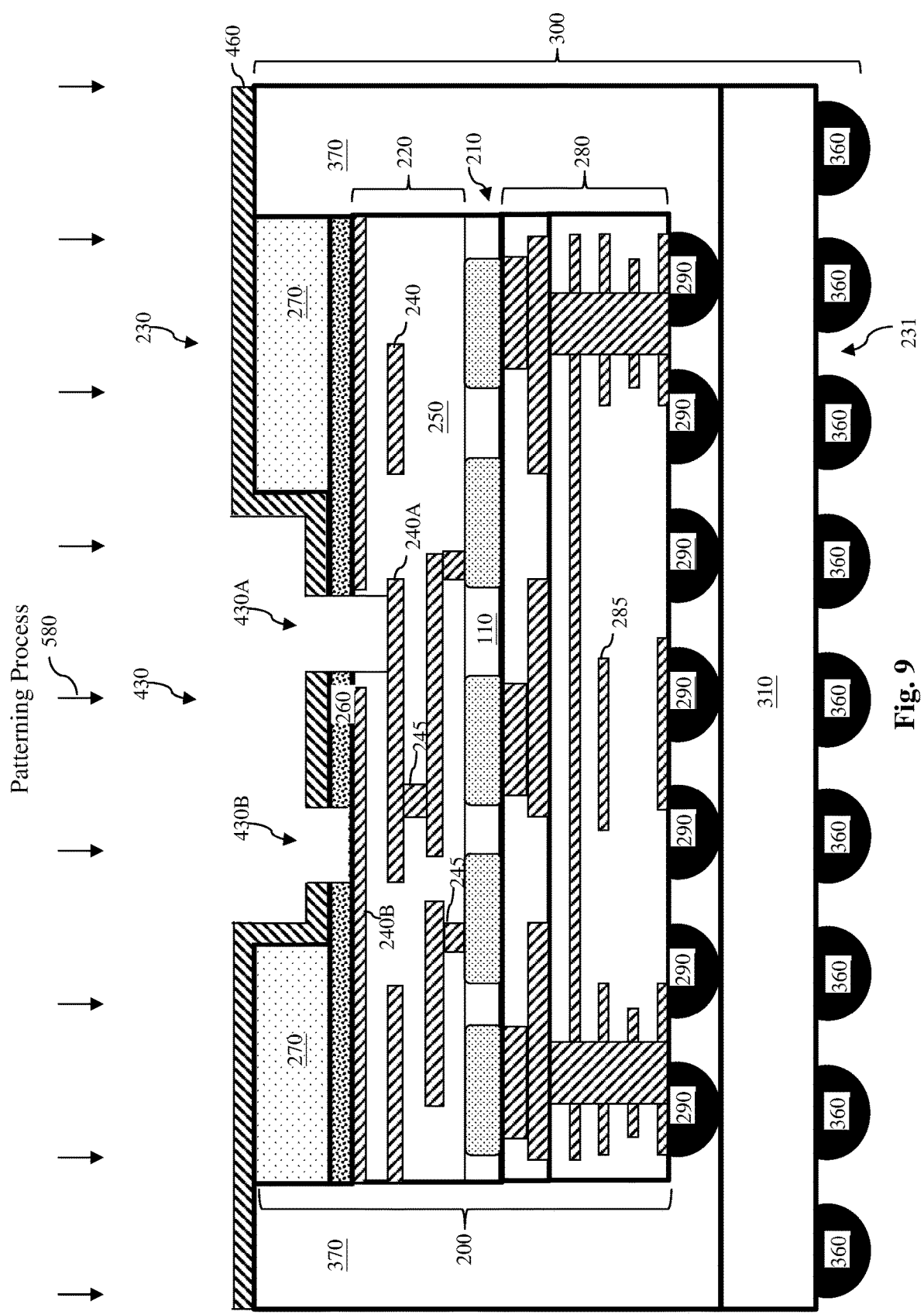

Referring now to FIG. 9, a patterning process 580 is performed to the IC package assembly 300 to extend the opening 430A and the opening 430B—which may both be viewed as extensions of the opening 430—further downwards. For example, the etching process 580 extends the opening 430A partially through the interconnect structure 220. The opening 430A stops at, and exposes, a metal line 240A of the interconnect structure 220. The etching process 580 also extends the opening 430B through the bonding layer 260. The opening 430B stops at, and exposes, a metal line 240B of the interconnect structure 220, which may be located in a higher metal layer than the metal line 240A in this embodiment. In some embodiments, the metal line 240A and the metal line 240B may be electrically coupled to different transistors of the transistors 210. The different transistors may belong to different electrical circuits in some embodiments, or they may belong to a same electrical circuit in some other embodiments.

The locations of the metal lines 240A and 240B are not randomly chosen but specifically configured. For example, a preliminary fault analysis may indicate that the transistors coupled to the metal lines 240A and 240B may be the candidate transistors for causing the faults. In order to verify whether these transistors are indeed the reasons for the faults, the debugging process herein will extract and analyze the signals emitted by these transistors when the transistors are operating in a predetermined mode. Here, the exposure of the different metal lines 240A and 240B allow the signals of the different transistors to be emitted through the openings 430A and 430B, which may then be detected by a detection tool placed on the front side 230 of the IC package assembly 300 as a part of the fault analysis.

It is understood that although two openings 430A and 430B are formed in the embodiment illustrated herein, any number of openings (which may expose any one of the metal lines 240A in any one of the different metal layers) may be formed in other embodiments. These openings formed may have different lateral and/or vertical dimensions as well.

Figure 10:
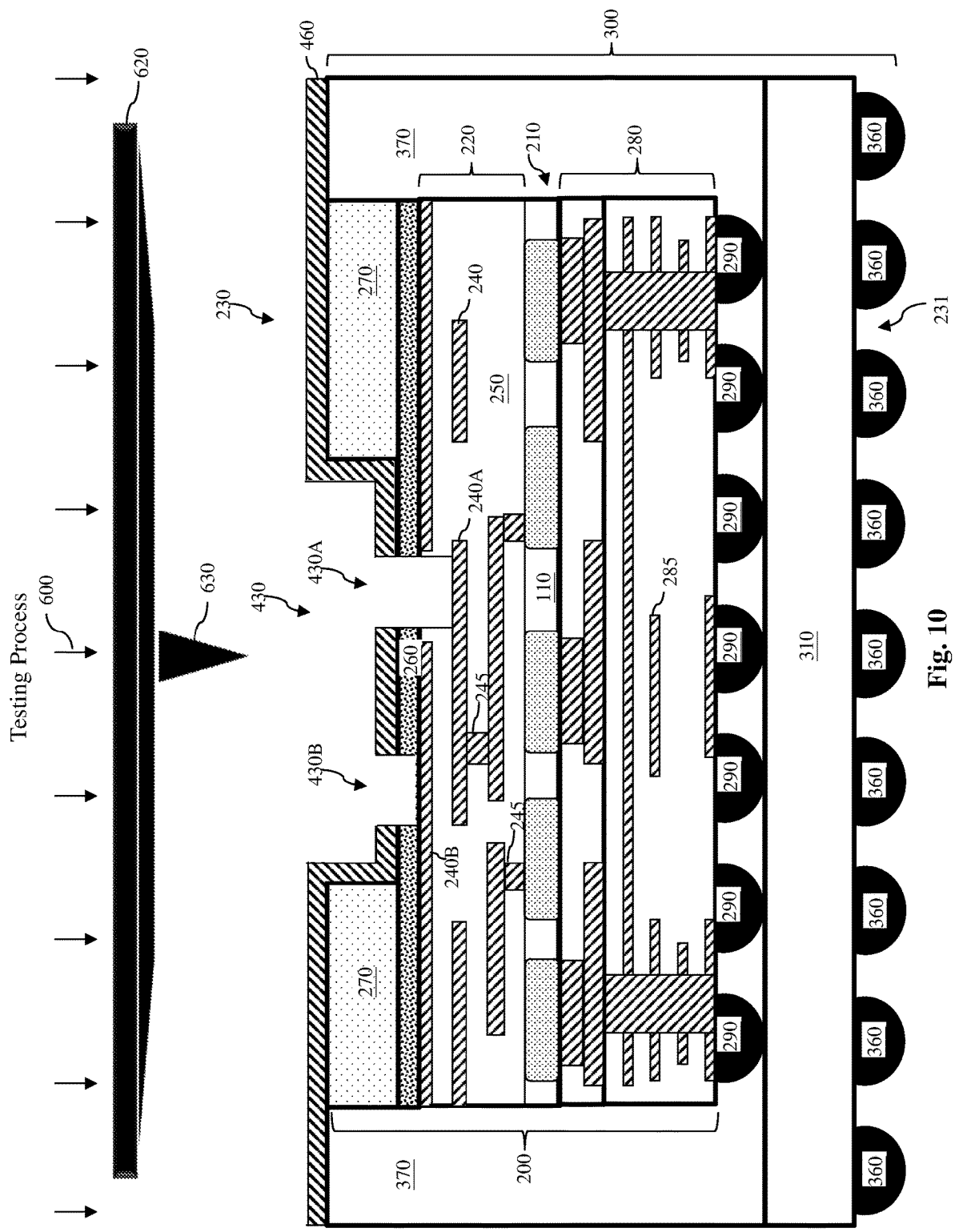
Figure 11:
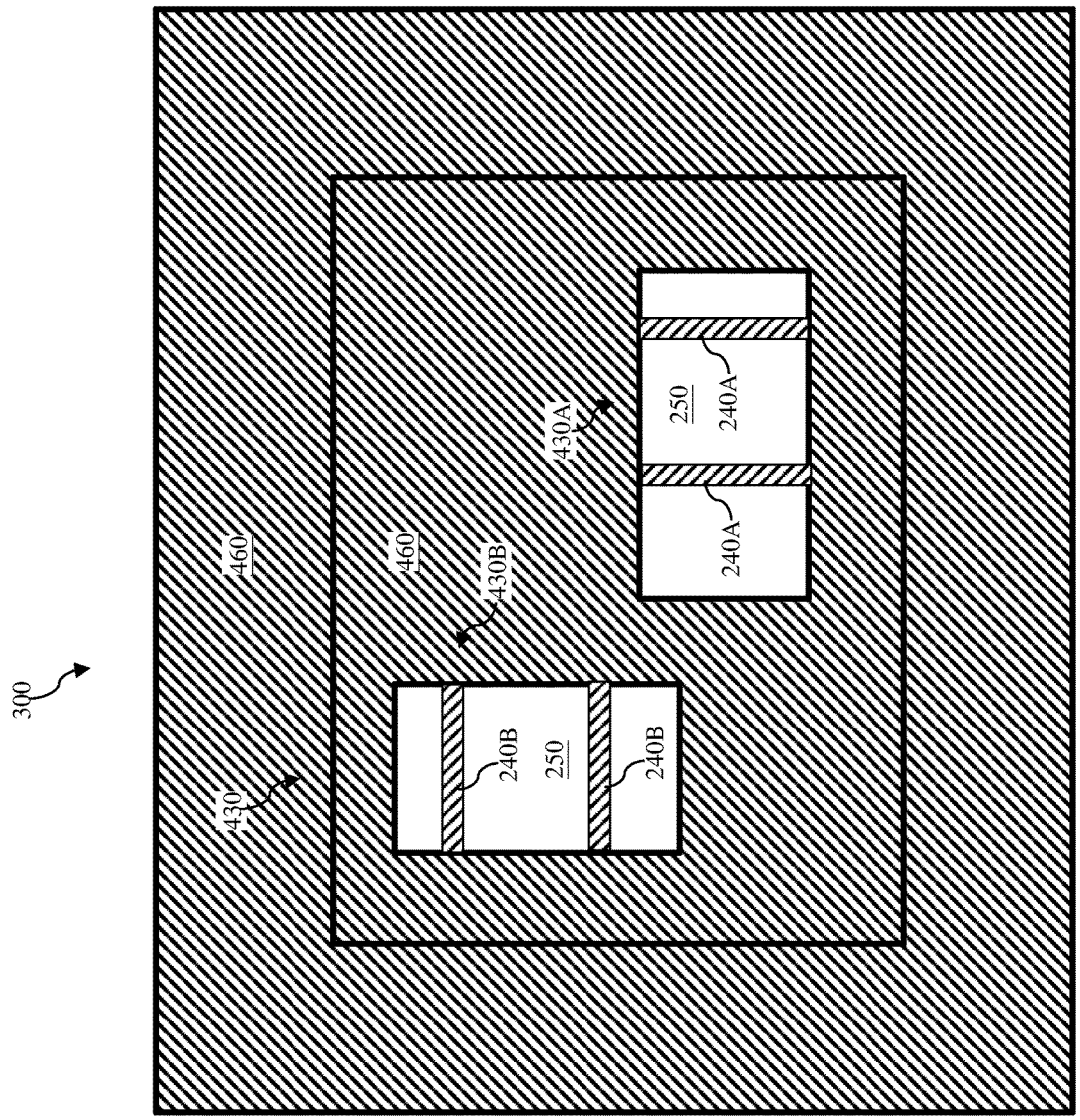
FIG. 11 illustrates a planar top view of the IC package assembly according to embodiments of the present disclosure.

Referring now to FIG. 10, a testing process 600 is performed to debug the IC package assembly as a part of the debugging process herein. In the testing process 600, a detection tool 620 is placed over the front side 230 of the IC package assembly 300. The detection tool 620 may be configured to detect signals 630 (which may be electrical signals or optical signals) emitted by the IC die 200. In that regard, the IC die 200 may receive one or more testing signals from an automated testing equipment (ATE) tool, which may be placed on the back side 231 of the IC package assembly 300 to supply the testing signals through the substrate 310. The testing signals force the IC die 200 to operate in a particular mode, and in response, the IC die 200 emits the signals 630 through the front side 230. The signals 630, which may include multiple signals from different transistors, are transmitted through the metal lines such as metal lines 240A and 240B. The openings 430A and 430B expose portions of the metal lines 240A and 240B, respectively, which allows the detection tool 620 to detect the signals 630 through the metal lines 240A and 240B.

In some embodiments, the detection tool 620 includes an electron beam (e-beam) machine. The detection tool 620 may analyze the signals 630 and translate them into a plot, a graph, an image, a plurality of numbers, or another suitable analytical result. Based on the analytical result produced by the detection tool 620, a machine or an engineer/technician may identify the portions of the circuitry of the IC die 200 that produced a fault or failure. For example, based on the analytical result, a determination may be made that two transistors in a region A of the IC die 200 that should have been electrically isolated have somehow been electrically shorted together. As another example, based on the analytical result, a determination may be made that a transistor in a region B of the IC die 200 is producing too much, or not enough, electrical current (e.g., greater than or less than a predefined threshold). As yet another example, based on the analytical result, a determination may be made that a microelectronic component (e.g., a source/drain or a gate) in a region C of the IC die 200 is missing or is structurally defective due to a fabrication-related issue. It is understood that these faults discussed above are merely examples and are not intended to be limiting.

Once the faults or their causes/sources have been identified, they can be communicated to appropriate personnel (and/or machines), so that manufacturing processes of the IC die 200 or the IC package assembly 300 may be adjusted to reduce or eliminate the likelihood of these faults occurring in the future. As a result, device performance and/or yield may be improved. Again, although the presence of metallization components on both the front side 230 and the back side 231 of the IC die 200 herein may complicate the debugging of the IC die 200, the solutions devised by the present disclosure discussed above can sufficiently address the issues that arise. For example, by partially removing the carrier substrate 270 and forming openings through the carrier substrate 270 and the interconnect structure 220 from the front side, the target metal lines 240A and 240B can be exposed, which allows the signals emitted by the IC die 200 during a testing process to be collected by the detection tool 620 without being blocked. In addition, since the carrier substrate 270 is not completely removed, potential damage that could be caused by a complete removal of the carrier substrate 270 is avoided. The remaining portions of the carrier substrate 270 can also protect the rest of the IC package assembly 300 from mechanical damage, contaminant particles, or moisture (e.g., from water vapor penetration). Furthermore, the formation of the conductive layer 460 allows the conductive layer 460 to not only serve as an etching mask during the formation of the openings, but also to promote heat dissipation, since the conductive layer 460 is thermally conductive.

It is also understood that, although the present disclosure utilizes an SPR die as an example embodiment of the IC die 200 that includes metallization components on both the front side 230 and the back side 231, the various aspects of the present disclosure may apply to other types of IC dies (or IC package assemblies).

To further illustrate the various aspects of the present disclosure, a top view (also referred to as a planar view) of various components of the present disclosure is illustrated in FIG. 11. In more detail, the top view of FIG. 11 is obtained by looking down from the front side 230. FIG. 11 illustrates portions of the IC package assembly 300, but not the detection tool 620. The illustrated portions of the IC package assembly 300 include the conductive layer 460 (since it is disposed over the carrier substrate 270 and over the bonding layer 260) and portions of the interconnect structure 220 exposed by the openings 430A and 430B. For example, the metal lines 240A are exposed by the opening 430A, and the metal lines 240B are exposed by the opening 430B. As discussed above, the openings 430A and 430B may have different shapes and sizes, and the metal lines 240A and 240B may belong to different metal layers. Also as discussed above, the openings 430A and 430B are parts of the larger opening 430, which exposes portions of the conductive layer 460 that are formed directly on the bonding layer 260.

In the embodiment illustrated in FIG. 12, the openings 430, 430A, and 430B may each have a substantially rectangular top view profile. However, such a profile is not limiting. In other embodiments, the patterning processes 500, 520, 550 and/or 580 may be configured to form openings having different top view profiles. For example, FIG. 12 illustrates various example top view profiles of different embodiments of the openings 430, 430A, and/or 430B. In more detail, a trench may have a top view profile 700A resembling a square with rounded corners, or a top view profile 700B resembling a rectangle with rounded corners, or a top view profile 700C resembling an oval or an ellipse, or a top view profile 700D resembling a triangle, or a top view profile 700E resembling a circle, or a top view profile 700F resembling a trapezoid, or a top view profile 700G resembling a hexagon, or a top view profile 700H that is an arbitrarily shape or a polygon.

The IC die 200 (or the package assembly 300) discussed above may be implemented in a variety of IC applications, including memory devices such as Static Random-Access Memory (SRAM) devices. In that regard, FIG. 13 illustrates an example circuit schematic for a single-port SRAM cell (e.g., 1-bit SRAM cell) 800 in which the IC die 200 may be implemented. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 14 illustrates an integrated circuit fabrication system 900 according to embodiments of the present disclosure, which may be used to fabricate the IC die 200 and/or the IC package assembly 300 of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 15 is a flowchart illustrating a method 1000 of packaging and testing an IC package assembly according to various aspects of the present disclosure. The method 1000 includes a step 1010 to reduce a thickness of a carrier substrate of an Integrated Circuit (IC) package assembly. The IC package assembly further includes: a semiconductor substrate containing a plurality of transistors, a first metallization structure disposed over a first side of the semiconductor substrate, and a second metallization structure disposed over a second side of the semiconductor substrate opposite the first side. The first metallization structure is located between the carrier substrate and the semiconductor substrate.

The method 1000 includes a step 1020 to form an opening through the carrier substrate.

The method 1000 includes a step 1030 to coat a conductive layer over the carrier substrate, wherein the conductive layer partially fills the opening.

The method 1000 includes a step 1040 to perform a plurality of patterning processes. The patterning processes expose different portions of the first metallization structure to the opening. The conductive layer serves as a protective mask during the patterning processes.

In some embodiments, the IC package assembly further includes a bonding layer that is disposed between the carrier substrate and the first metallization structure. The patterning processes extend the opening through the bonding layer.

In some embodiments, the step 1040 includes: performing a first patterning process that extends a first portion of the opening through a first segment of the conductive layer but not through the bonding layer; performing a second patterning process that further extends the first portion of the opening through the bonding layer but not through the first metallization structure; performing a third patterning process that extends a second portion of the opening through a second segment of the conductive layer but not through the bonding layer; and performing a fourth patterning process that extends the first portion of the opening partially through the first metallization structure, the fourth patterning process further extending the second portion of the opening through the bonding layer but not through the first metallization structure. After the fourth patterning process has been performed: a first metallization component of the first metallization structure is exposed by the first portion of the opening; and a second metallization component of the first metallization structure is exposed by the second portion of the opening.

In some embodiments, the first metallization component and the second metallization component belong to different metallization layers of the first metallization structure.

It is understood that additional processes may be performed before, during, or after the steps 1010-1040 of the method 1000. For example, in some embodiments, the method 1000 may further include a step of analyzing the signals detected by the signal detection tool, as well as a step of identifying one or more faults of the IC package assembly based on the analyzing of the signals. As another example, the method 1000 may further include a step of operating the IC package assembly in a predetermined mode. The signals are emitted by the IC package assembly in response to being operated in the predetermined mode. In some embodiments, the IC package assembly further includes a printed circuit board (PCB) substrate that is bonded to the semiconductor substrate at least in part through the second metallization structure. In some embodiments, the operating the IC package in the predetermined mode includes: generating test signals with an automated testing equipment (ATE) tool and routing the testing signals to the IC package assembly through the PCB substrate.

In summary, the present disclosure pertains to packaging and testing an IC device to facilitate the debugging of the IC device. In more detail, the IC device (e.g., an IC package assembly) herein has metallization components on both its front side and back side. For example, the IC device may have an interconnect structure (including multiple metal layers) formed on its front side and a power delivery network (PDN) formed on its back side. The IC device also has a carrier substrate located on the front side. Rather than removing the carrier substrate completely, a thickness of the carrier substrate is reduced via a thinning process. An opening is then formed in the carrier substrate, and a conductive layer is formed partially in the opening. Using the conductive layer as a mask layer, different portions of the opening may be further extended into the interconnect structure to expose different metal lines. During a debugging process, an automated testing equipment (ATE) tool may feed test signals to the IC device, so that the IC device will operate in a predetermined mode and generate signals accordingly. These signals are transmitted through the metal lines exposed by the openings and detected by a signal detection tool placed at the front side of the IC device. Based on an analysis of the detected signals, the source of the faults causing failures of performance issues for the IC device may be identified.

The present disclosure may offer advantages over conventional devices. However, it is understood that not all advantages are discussed herein, different embodiments may offer different advantages, and that no particular advantage is required for any embodiment. One advantage is that the present disclosure facilitates the debugging process in spite of the presence of metallization components on both the front side and the back side of the IC device. In more detail, conventional IC devices may have metallization structures on the front side, but not the back side. As such, the signal detection tool may be placed on the back side of the IC device to detect signals emitted by the IC device under-test. However, such an approach is not feasible for the IC device herein, since the PDN on the back side of the IC device under-test could block the signals emitted by the IC device. Another approach is to remove the carrier substrate completely from the front side, so as to expose the interconnect structure for testing purposes. However, such an approach may damage the interconnect structure (e.g., by causing a collapse or deformation of the metal lines therein) and is therefore not an optimal solution. In comparison, the present disclosure removes the carrier substrate partially, so that openings in different portions of the carrier substrate may expose different target metal lines of the interconnect structure. As such, the signals emitted by the IC device may propagate to the signal detection tool through the openings with minimal to no interference, which allows accurate debugging to be performed on the IC device. In addition, the remaining portions of the carrier substrate can protect the rest of the IC device from mechanical damage, contaminant particles, or moisture. Furthermore, the conductive layer formed in the opening may not just serve as a mask layer to define the smaller openings that extend into the interconnect structure, but it also facilitates heat dissipation, since it is also thermally conductive. Other advantages may include compatibility with existing fabrication processes and the ease and low cost of implementation.

The advanced lithography process, method, and materials described above can be used in many applications, including in IC devices using fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

One aspect of the present disclosure pertains to a chip package assembly. The chip package assembly includes a semiconductor substrate in which a plurality of transistors is formed. A first structure is disposed over a first side of the semiconductor substrate. The first structure contains a plurality of first metallization components. A carrier substrate is disposed over the first structure. The first structure is located between the carrier substrate and the semiconductor substrate. One or more openings extend through the carrier substrate and expose one or more regions of the first structure to the first side. A second structure is disposed over a second side of the semiconductor substrate opposite the first side. The second structure contains a plurality of second metallization components.

Another aspect of the present disclosure pertains to a system. The system includes an Integrated Circuit (IC) package assembly and a signal detection tool. The IC package assembly includes a semiconductor substrate containing electrical circuitry. The IC package assembly includes an interconnect structure disposed over a first side of the semiconductor substrate. The interconnect structure includes a plurality of interconnected metal layers. The metal layers each include a plurality of metal lines. The IC package assembly includes a carrier substrate bonded to the semiconductor substrate at least in part through the interconnect structure. One or more openings extend through the carrier substrate from the first side and expose one or more of the metal lines. The IC package assembly includes a power delivery network (PDN) structure disposed over a second side of the semiconductor substrate. The signal detection tool is placed over the first side of the IC package assembly. The signal detection tool is configured to detect signals emitted by the IC package assembly through the one or more openings.

Yet another aspect of the present disclosure pertains to a method. A thickness of a carrier substrate of an Integrated Circuit (IC) package assembly is reduced. The IC package assembly further includes: a semiconductor substrate containing a plurality of transistors, a first metallization structure disposed over a first side of the semiconductor substrate, and a second metallization structure disposed over a second side of the semiconductor substrate opposite the first side. The first metallization structure is located between the carrier substrate and the semiconductor substrate. An opening is formed through the carrier substrate. A conductive layer is coated over the carrier substrate. The conductive layer partially fills the opening. A plurality of patterning processes is performed. The patterning processes expose different portions of the first metallization structure to the opening. The conductive layer serves as a protective mask during the patterning processes.

What is claimed is:

1. A chip package assembly, comprising:
   a semiconductor substrate in which a plurality of transistors is formed;
   a first structure disposed over a first side of the semiconductor substrate, wherein the first structure contains a plurality of first metallization components;
   a carrier substrate disposed over the first structure, wherein the first structure is located between the carrier substrate and the semiconductor substrate, and wherein one or more openings extend through the carrier substrate and expose one or more regions of the first structure to the first side; and
   a second structure disposed over a second side of the semiconductor substrate opposite the first side, wherein the second structure contains a plurality of second metallization components.

2. The chip package assembly of claim 1, further comprising a bonding layer that is bonded between the first structure and the carrier substrate, wherein the bonding layer contains a dielectric material.

3. The chip package assembly of claim 2, wherein the one or more openings each extend through the bonding layer.

4. The chip package assembly of claim 2, further comprising a conductive layer disposed partially in the one or more openings, wherein portions of the conductive layer are disposed on upper surfaces and side surfaces of the carrier substrate and on upper surfaces of the bonding layer.

5. The chip package assembly of claim 1, wherein:
the first structure includes an interconnect structure having a plurality of different metal layers;
the one or more openings include at least a first opening and a second opening;
the first opening exposes a first one of the first metallization components located in a first metal layer of the interconnect structure; and
the second opening exposes a second one of the first metallization components located in a second metal layer of the interconnect structure.

6. The chip package assembly of claim 1, further comprising a printed circuit board (PCB) substrate disposed over the second structure, wherein the second structure is located between the PCB substrate and the semiconductor substrate.

7. The chip package assembly of claim 1, wherein the second metallization components are components of a power delivery network (PDN).

8. A system, comprising:
an Integrated Circuit (IC) package assembly that includes:
a semiconductor substrate containing electrical circuitry;
an interconnect structure disposed over a first side of the semiconductor substrate, wherein the interconnect structure includes a plurality of interconnected metal layers, and wherein the metal layers each include a plurality of metal lines;
a carrier substrate bonded to the semiconductor substrate at least in part through the interconnect structure, wherein one or more openings extend through the carrier substrate from the first side and expose one or more of the metal lines; and
a power delivery network (PDN) structure disposed over a second side of the semiconductor substrate; and
a signal detection tool placed over the first side of the IC package assembly, wherein the signal detection tool is configured to detect signals emitted by the IC package assembly through the one or more openings.

9. The system of claim 8, wherein the signal detection tool includes an electron beam machine.

10. The system of claim 8, further comprising an automated testing equipment (ATE) tool that forces the IC package assembly to operate in a predetermined mode; wherein:
the IC package assembly emits the signals in response to being forced to operate in the predetermined mode; and
the signal detection tool is further configured to analyze the detected signals and identify one or more faults of the IC package assembly based on an analysis of the detected signals.

11. The system of claim 8, wherein the IC package assembly further comprises a conductive layer coated on the carrier substrate and partially filling the one or more openings.

12. The system of claim 8, wherein:
the one or more openings include a plurality of openings; and
at least some of the openings have different depths than other ones of the openings.

13. A method, comprising:
reducing a thickness of a carrier substrate of an Integrated Circuit (IC) package assembly, wherein the IC package assembly further includes: a semiconductor substrate containing a plurality of transistors, a first metallization structure disposed over a first side of the semiconductor substrate, and a second metallization structure disposed over a second side of the semiconductor substrate opposite the first side, and wherein the first metallization structure is located between the carrier substrate and the semiconductor substrate;
forming an opening through the carrier substrate;
coating a conductive layer over the carrier substrate, wherein the conductive layer partially fills the opening; and
performing a plurality of patterning processes, wherein the patterning processes expose different portions of the first metallization structure to the opening, and wherein the conductive layer serves as a protective mask during the patterning processes.

14. The method of claim 13, wherein:
the IC package assembly further includes a bonding layer that is disposed between the carrier substrate and the first metallization structure; and
the patterning processes extend the opening through the bonding layer.

15. The method of claim 14, wherein the performing of the plurality of patterning processes includes:
performing a first patterning process that extends a first portion of the opening through a first segment of the conductive layer but not through the bonding layer;
performing a second patterning process that further extends the first portion of the opening through the bonding layer but not through the first metallization structure; performing a third patterning process that extends a second portion of the opening through a second segment of the conductive layer but not through the bonding layer; and
performing a fourth patterning process that extends the first portion of the opening partially through the first metallization structure, the fourth patterning process further extending the second portion of the opening through the bonding layer but not through the first metallization structure;
wherein after the fourth patterning process has been performed:
a first metallization component of the first metallization structure is exposed by the first portion of the opening; and
a second metallization component of the first metallization structure is exposed by the second portion of the opening.

16. The method of claim 15, wherein the first metallization component and the second metallization component belong to different metallization layers of the first metallization structure.

17. The method of claim 13, further comprising:
placing a signal detection tool over the first side of the IC package assembly; and
detecting, using the signal detection tool, signals emitted by the IC package assembly, wherein the signals propagate out of the IC package assembly through the opening.

18. The method of claim 17, further comprising:
analyzing the signals detected by the signal detection tool; and
identifying one or more faults of the IC package assembly based on the analyzing of the signals.

19. The method of claim 17, further comprising: operating the IC package assembly in a predetermined mode, wherein the signals are emitted by the IC package assembly in response to being operated in the predetermined mode.

20. The method of claim 19, wherein the IC package assembly further includes a printed circuit board (PCB)

substrate that is bonded to the semiconductor substrate at least in part through the second metallization structure, wherein the operating the IC package in the predetermined mode includes:
  generating test signals with an automated testing equipment (ATE) tool; and
  routing the testing signals to the IC package assembly through the PCB substrate.

* * * * *